United States Patent
Gao et al.

(10) Patent No.: US 10,973,155 B2
(45) Date of Patent: Apr. 6, 2021

(54) HEAT DISSIPATION PLATE ASSEMBLY, DISPLAY MODULE AND ITS ASSEMBLING METHOD

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yang Gao, Beijing (CN); Shuquan Yang, Beijing (CN); Qiang He, Beijing (CN); Chao Yang, Beijing (CN); Yang Yang, Beijing (CN); Mengyuan Pang, Beijing (CN)

(73) Assignees: Chengdu Boe Optoelectronics Technology Co., Ltd., Sichuan (CN); Boe Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/906,693

(22) Filed: Jun. 19, 2020

(65) Prior Publication Data

US 2021/0051822 A1 Feb. 18, 2021

(30) Foreign Application Priority Data

Aug. 15, 2019 (CN) .......................... 201910753736.9

(51) Int. Cl.
*H01L 23/40* (2006.01)
*B23K 1/00* (2006.01)
(Continued)

(52) U.S. Cl.
CPC .......... *H05K 7/20963* (2013.01); *G09F 9/301* (2013.01)

(58) Field of Classification Search
CPC ........ F21V 29/677; F21V 31/03; F21K 9/232; F21Y 2115/10; H05K 7/20963; G09F 9/301
See application file for complete search history.

(56) References Cited

U.S. PATENT DOCUMENTS

2014/0126227 A1* 5/2014 Yoon ....................... G09F 9/301
362/382
2016/0358837 A1* 12/2016 Liang ................. H01L 23/4334
(Continued)

*Primary Examiner* — Tracie Y Green
(74) *Attorney, Agent, or Firm* — Muncy, Geissler, Olds & Lowe, P.C.

(57) ABSTRACT

A display substrate includes a first region, a second region, and a bendable region between the first region and the second region, and a heat dissipation plate assembly for heat dissipation of the display substrate includes: a first release film; a heat dissipation plate, comprising a first portion and a second portion which are separated by a space and located on the first release film; a protective film, located on a side of the heat dissipation plate distal to the first release film, having a substantially same shape as the heat dissipation plate, and comprising a third portion located on the first portion and a fourth portion located on the second portion, the third portion being able to be bonded to the first region of the display substrate, and the fourth portion being able to be bonded to the second region of the display substrate; and a second release film, located on a side of the protective film distal to the heat dissipation plate and having a substantially same shape as the first release film.

20 Claims, 2 Drawing Sheets

(51) Int. Cl.
  *H05K 7/20*   (2006.01)
  *G09F 9/30*   (2006.01)

(56) References Cited

U.S. PATENT DOCUMENTS

| | | | |
|---|---|---|---|
| 2018/0190570 A1* | 7/2018 | Momose | H01L 23/40 |
| 2019/0096913 A1* | 3/2019 | Lee | H01L 27/1218 |
| 2020/0367386 A1* | 11/2020 | Kim | H05K 7/20963 |

* cited by examiner

HEAT DISSIPATION PLATE ASSEMBLY, DISPLAY MODULE AND ITS ASSEMBLING METHOD

CROSS-REFERENCE TO RELATED APPLICATION

This application claims a priority to Chinese Patent Application No. 201910753736.9 filed on Aug. 15, 2019, the disclosures of which are incorporated in their entirety by reference herein.

TECHNICAL FIELD

The present disclosure relates to the field of manufacturing display products, in particular to a heat dissipation plate assembly, a display module and its assembling method.

BACKGROUND

With the development of display industry, an organic light-emitting diode (OLED), which is a new light-emitting device, has been widely researched and applied in the field of display technology. One advantage of the OLED is that it can be applied to flexible displays, is capable of achieving frame narrowing, bending, full-screen frame narrowing, etc., and thus has wide development prospects.

SUMMARY

In a first aspect, embodiments of the present disclosure provide a heat dissipation plate assembly for heat dissipation of a display substrate, the display substrate including a first region, a second region, and a bendable region between the first region and the second region, wherein the heat dissipation plate assembly includes: a first release film; a heat dissipation plate, including a first portion and a second portion which are separated by a space and located on the first release film; a protective film, located on a side of the heat dissipation plate distal to the first release film, having a substantially same shape as the heat dissipation plate, and including a third portion located on the first portion and a fourth portion located on the second portion, the third portion being able to be bonded to the first region of the display substrate, and the fourth portion being able to be bonded to the second region of the display substrate; and a second release film, located on a side of the protective film distal to the heat dissipation plate and having a substantially same shape as the first release film, wherein the heat dissipation plate is integrated with the protective film, and a portion of the protective film corresponding to the bendable region of the display substrate is removed while the heat dissipation plate is subjected to a cutting processing.

According to some optional embodiments of the present disclosure, the protective film is connected with the heat dissipation plate through a first connection adhesive layer.

According to some optional embodiments of the present disclosure, the first connection adhesive layer is formed of a pressure sensitive adhesive.

According to some optional embodiments of the present disclosure, a second connection adhesive layer is provided between the second release film and the protective film.

According to some optional embodiments of the present disclosure, the second connection adhesive layer is formed of a pressure sensitive adhesive.

According to some optional embodiments of the present disclosure, the heat dissipation plate includes one or more of grid tape, foam, graphite sheet, and copper foil.

According to some optional embodiments of the present disclosure, the display substrate is a flexible display substrate.

According to some optional embodiments of the present disclosure, the display substrate is an organic light-emitting diode (OLED) display substrate.

In a second aspect, embodiments of the present disclosure further provide a display module including a heat dissipation plate assembly for heat dissipation of a display substrate, the display substrate including a first region, a second region, and a bendable region between the first region and the second region, wherein the heat dissipation plate assembly includes: a first release film; a heat dissipation plate, including a first portion and a second portion which are separated by a space and located on the first release film; a protective film, located on a side of the heat dissipation plate distal to the first release film, having a substantially same shape as the heat dissipation plate, and including a third portion located on the first portion and a fourth portion located on the second portion, the third portion being able to be bonded to the first region of the display substrate, and the fourth portion being able to be bonded to the second region of the display substrate; and a second release film, located on a side of the protective film distal to the heat dissipation plate and having a substantially same shape as the first release film, wherein the heat dissipation plate is integrated with the protective film, and a portion of the protective film corresponding to the bendable region of the display substrate is removed while the heat dissipation plate is subjected to a cutting processing.

According to some optional embodiments of the present disclosure, the protective film is connected with the heat dissipation plate through a first connection adhesive layer.

According to some optional embodiments of the present disclosure, the first connection adhesive layer is formed of a pressure sensitive adhesive.

According to some optional embodiments of the present disclosure, a second connection adhesive layer is provided between the second release film and the protective film.

According to some optional embodiments of the present disclosure, the second connection adhesive layer is formed of a pressure sensitive adhesive.

According to some optional embodiments of the present disclosure, the heat dissipation plate comprises one or more of grid tape, foam, graphite sheet, and copper foil.

According to some optional embodiments of the present disclosure, the display substrate is a flexible display substrate which is an OLED display substrate.

In a third aspect, embodiments of the present disclosure further provide a method for assembling a display module, including: bonding a cover plate and a display substrate; bonding a heat dissipation plate assembly to the display substrate; and bending a bendable region of the display substrate to which the heat dissipation plate assembly has been bonded, wherein the display substrate includes a first region, a second region and the bendable region between the first region and the second region, wherein the heat dissipation plate assembly includes: a first release film; a heat dissipation plate, including a first portion and a second portion which are separated by a space and located on the first release film; a protective film, located on a side of the heat dissipation plate distal to the first release film, having a substantially same shape as the heat dissipation plate, and including a third portion located on the first portion and a fourth portion located on the second portion, the third portion being able to be bonded to the first region of the display substrate, and the fourth portion being able to be bonded to the second region of the display substrate; and a second release film, located on a side of the protective film distal to the heat dissipation plate and having a substantially same shape as the first release film, wherein the heat dissipation plate is integrated with the protective film, and a portion of the protective film corresponding to the bendable region of the display substrate is removed while the heat dissipation plate is subjected to a cutting processing.

According to some optional embodiments of the present disclosure, the bonding the bonding the heat dissipation plate assembly to the display substrate includes: removing the protective film on a side of the display substrate distal to the cover plate; removing the second release film on the protective film of the heat dissipation plate assembly; bonding the heat dissipation plate assembly, from which the second release film has been removed, to the side of the display substrate distal to the cover plate; and removing the first release film and the second portion of the heat dissipation plate.

According to some optional embodiments of the present disclosure, the bending the bendable region of the display substrate to which the heat dissipation plate assembly has been bonded includes: bending the bendable region of the display substrate to which the heat dissipation plate assembly has been bonded so as to bend the fourth portion reversely and bond the reversely bended fourth portion to the first portion of the heat dissipation plate.

According to some optional embodiments of the present disclosure, the display substrate is a display motherboard or a single display substrate.

According to some optional embodiments of the present disclosure, prior to the bonding the cover plate and the display substrate, the method further includes cutting the display motherboard non-rectangularly to obtain a plurality of display substrates.

BRIEF DESCRIPTION OF THE DRAWINGS

In order to illustrate the technical solutions of the embodiments of the present disclosure more apparently, the accompanying drawings required in the description of the embodiments of the present disclosure will be briefly introduced below. It is evident that the drawings used in the following description relate to only some embodiments of the present disclosure, and based on these drawings, the other drawings can be obtained by those of ordinary skill in the art without exercising any inventive work.

DETAILED DESCRIPTION

Figure 1:
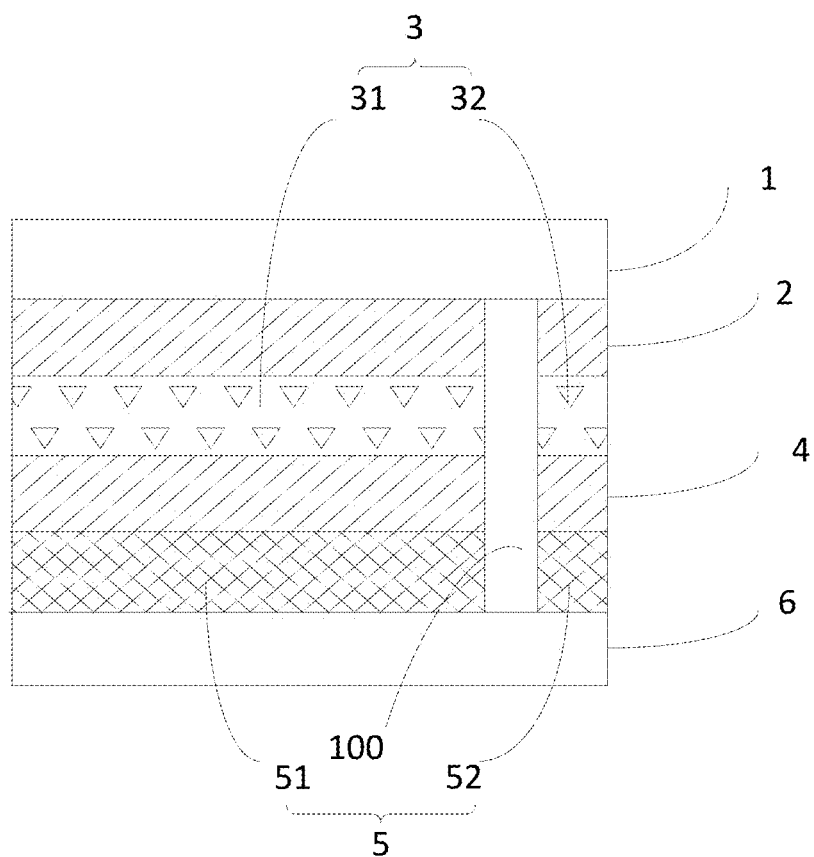
FIG. 1 shows a schematic diagram of a structural of a heat dissipation plate assembly in accordance with some embodiments of the present disclosure.

In related art, a display substrate has a display surface and a non-display surface that are arranged opposite to each other. The display surface displays an image, and the non-display surface does not display any image. When performing Pad bending, a Pad area of the display substrate can be bent onto the non-display surface of the display substrate to reduce a width of the non-display area of the display substrate, thereby reducing a size of the frame of the display device. At present, a protective film is usually bonded to the non-display surface of the display substrate. In order to avoid an influence of a stress generated in the bending process on the pad area, the protective film of the area to be bent of the display substrate needs to be removed before Pad bending. The non-display surface of the display substrate is also referred to as a back side of the display substrate, the protective film bonded to the non-display surface of the display substrate is also referred to as a back film, and the area to be bent is located in the Pad area. Due to high adhesion of the back film, it is difficult to tear off the back film in the bendable region.

In order to make the objects, technical solutions, and advantages of the embodiments of the present disclosure more apparent, the technical solutions of the embodiments of the present disclosure will be clearly and completely described hereinafter with reference to the accompanying drawings for the embodiments of the present disclosure. Obviously, the described embodiments are a part, rather than all, of the embodiments of the present disclosure. All the other embodiments obtained by those of ordinary skill in the art based on the described embodiments of the present disclosure fall within the protection scope of the present disclosure.

At present, there are two methods which are usually used to remove the protective film on the back side of the display substrate. One is to use a laser to burn off the protective film at the bendable position, and the other is to apply a protective film which has been slotted to the back side of the substrate. However, the laser burning process may damage the display substrate and cause residual back film adhesive to be not uniform, resulting in uneven stress during the bending process and thus in poor removal effect; on the other hand, the protective film which has been slotted has high cost.

In view of the above technical problems, this embodiment provides a heat dissipation plate assembly, in which a protective film is integrated with a heat dissipation plate. When cutting the heat dissipation plate, a portion of the protective film corresponding to the bendable region of the display substrate is removed simultaneously and then bonded to a back side of the display substrate. As compared with the method in conventional technology, in which the portion of the protective film corresponding to the bendable region of the display substrate is removed separately after the protective film has been bonded to the back side of the display substrate, these embodiments of the present disclosure allow for a reduction of the step of removing the portion of the protective film corresponding to the bendable region of the display substrate separately after the protective film has been bonded to the back side of the display substrate. Therefore, the problems of damage to the display substrate and poor removal effect caused by laser burning part of the protective film are avoided, and the cost is also reduced.

Figure 2:
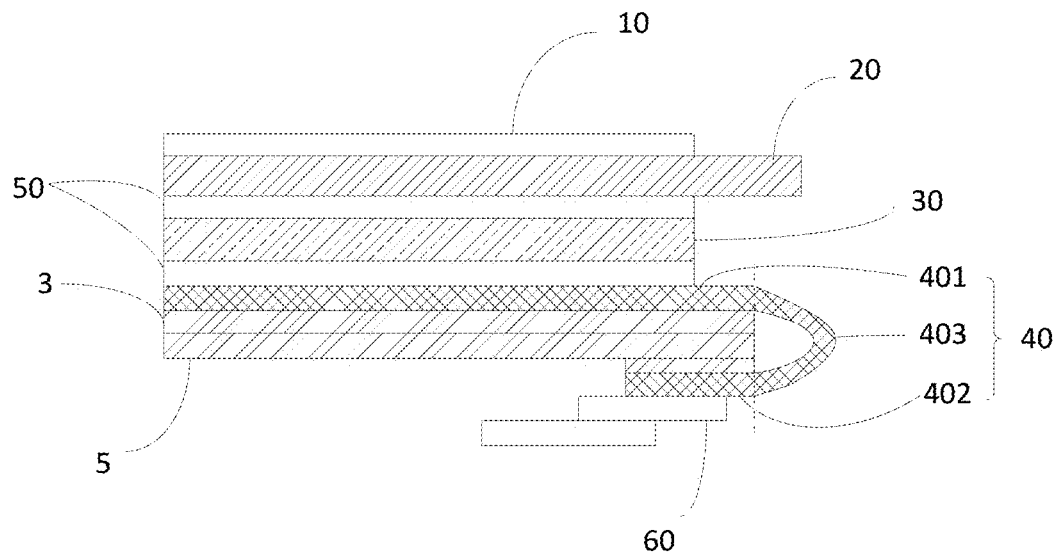
FIG. 2 shows a schematic diagram of a structure of a display module in accordance with some embodiments of the present disclosure.
Figure 3:
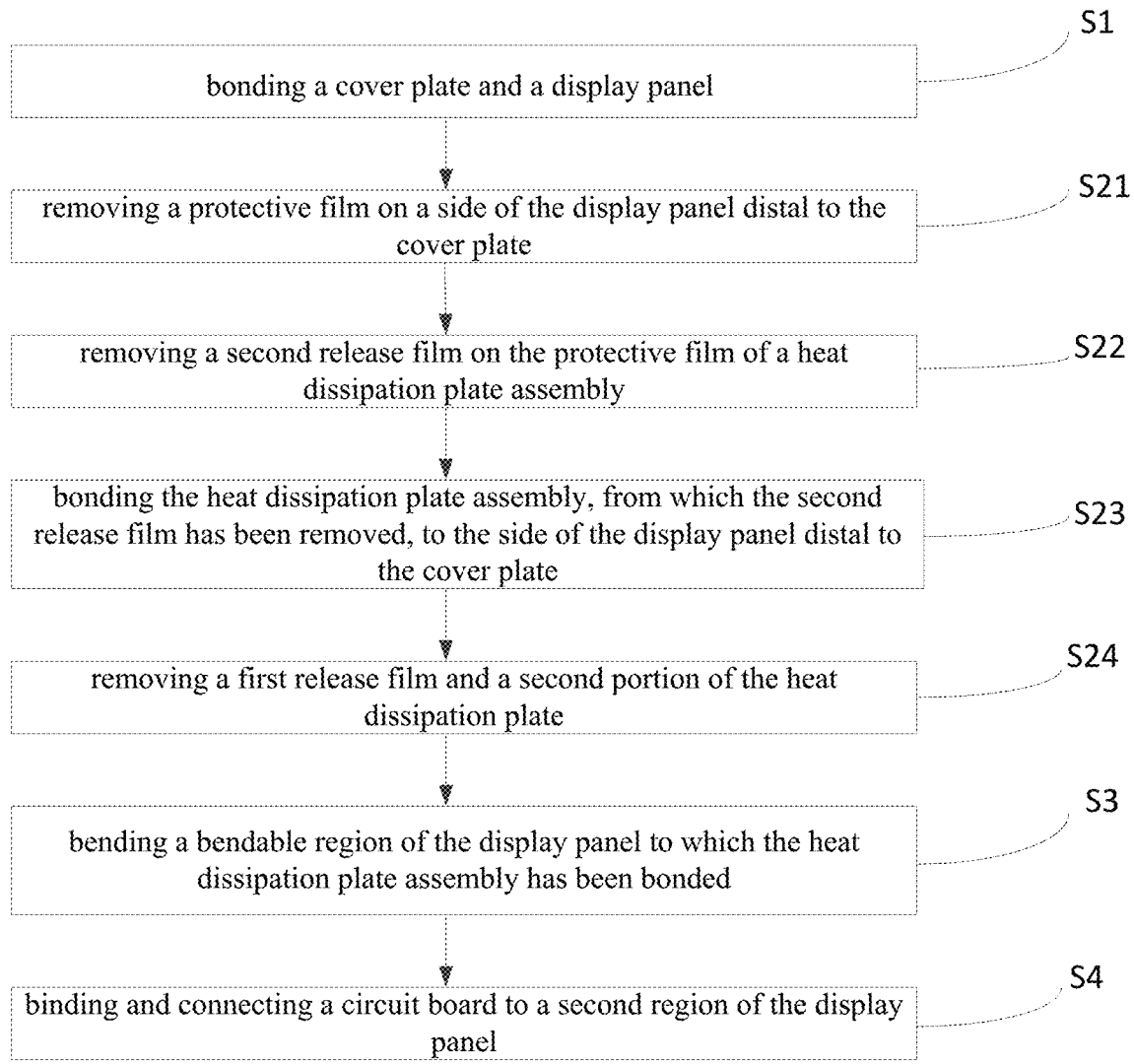
FIG. 3 shows a schematic flow chart of a method for assembling a display module in accordance with some embodiments of the present disclosure.

Specifically, as shown in FIGS. 1 and 2, this embodiment of the present disclosure provides a heat dissipation plate 5 assembly (SCF) for heat dissipation of a display substrate 40. Here, those skilled in the art can understand that FIGS. 1 and 2 show schematic views of cross-sections in a thickness direction of a structure of the heat dissipation plate 5 assembly and a structure of a display module, respectively. The display substrate 40 includes a first region 401, a second region 402, and a bendable region 403 between the first region 401 and the second region 402.

The heat dissipation plate 5 assembly includes: a first release film 6; the heat dissipation plate 5, including a first portion 51 and a second portion 52 separated by a space 100 and located on the first release film 5; a protective film 3 located on a side of the heat dissipation plate 5 distal to the first release film 6, having a substantially same shape as the heat dissipation plate 5, and including a third portion 31 located on the first portion 51 and a fourth portion 32 located on the second portion 52, the third portion 31 being able to be bonded to the first region 401 of the display substrate, and the fourth portion 32 being able to be bonded to the second region 402 of the display substrate; and a second release film 1, located on a side of the protective film 3 distal to the heat dissipation plate 5 and having a substantially same shape as the first release film 6.

Here, those skilled in the art can understand that by the protective film 3 having the same shape as the heat dissipation plate 5 as mentioned above is meant that the protective film 3 has a substantially same cross-sectional shape as the heat dissipation plate 5 in the exemplary cross-sectional view as shown in FIG. 1.

Similarly, by the second release film 1 having the same shape as the first release film 6 is meant that the second release film 1 has a substantially same cross-sectional shape as the first release film 6 in the exemplary cross-sectional view as shown in FIG. 1.

Here, the heat dissipation plate 5 mainly functions to dissipate heat, absorb shocks and shield an electromagnetic field. Main materials constituting the heat dissipation plate 5 include one or more of grid tape, foam, graphite sheet, and copper foil. Layers of the heat dissipation plate 5 are bonded together by using an electrically conductive adhesive. The grid tape mainly functions to avoid generation of air bubbles when bonding the heat dissipation plate 5 and an actual display substrate product together. Foam mainly functions to absorb shocks so as to enable damage to be reduced when the display substrate product is subjected to impacts or the like. The graphite sheet mainly functions to dissipate heat and prevent the display effect from be reduced by an excessively high temperature. Further, copper foil mainly functions to shield the electromagnetic field and dissipate heat.

With the above technical solution, the protective film 3 and the heat dissipation plate 5 are integrated together, that is, after the protective film 3 and the heat dissipation plate 5 have been bonded, the protective film 3 is cut while the heat dissipation plate 5 is subjected to a cutting processing, which is equivalent to slotting a portion of the protective film 3 corresponding to the bendable region of the display substrate, except that this step is performed at the same time of processing the heat dissipation plate 5. Therefore, the above technical solution reduces the cost as compared with the method in the conventional technology in which the protective film 3 is slotted separately, and avoids damage to the substrate and poor removal effect caused by laser burning as compared with the method in the conventional technology in which laser burning is adopted.

In this embodiment, optionally, the protective film 3 and the heat dissipation plate 5 are connected through a first connection adhesive layer 4. Here, those skilled in the art can understand that the first connection adhesive layer 4 is not an essential component. Optionally, there may be no intermediate layer between the protective film 3 and the heat dissipation plate 5, and the protective film 3 and the heat dissipation plate 5 are directly connected and bonded.

The first connection adhesive layer 4 is used to tightly bond the protective film 3 to the heat dissipation plate 5 so as to ensure a tight connection between the protective film 3 and the heat dissipation plate 5, and both the heat dissipation plate 5 and the protective film 3 are slotted, that is, a portion of the heat dissipation plate 5 that can be bonded to the bendable region of the display substrate is removed, so as to ensure a better slotting effect.

The first connection adhesive layer 4 can be made of various materials. In this embodiment, the first connection adhesive layer 4 is formed of a pressure-sensitive adhesive, but it is not limited thereto.

In this embodiment, a second connection adhesive layer 2 is provided between the second release film 1 and the protective film 3.

The second connection adhesive layer 2 is used to connect the second release film 1 and the protective film 3 to ensure a tight connection between the protective film 3 and the second release film 1 as well as flatness of a surface of the second release film 1, so that the second release film 1 can play a better protective role. Here, those skilled in the art can understand that the second connection adhesive layer 2 is not an essential component. Optionally, there may be no intermediate layer between the second release film 1 and the protective film 3, and the second release film 1 and the protective film 3 are directly connected and bonded.

The second connection adhesive layer 2 may be made of various materials. In this embodiment, the second connection adhesive layer 2 is formed of a pressure-sensitive adhesive, but it is not limited thereto.

As shown in FIGS. 1 and 2, an embodiment of the present disclosure further provides a display module including the heat dissipation plate 5 assembly as described above.

In this embodiment, the display module further includes a touch layer 30 arranged on a display side of the display substrate 40, a cover plate 20 arranged on the touch layer 30, and a protective film 10 arranged on the cover plate 20.

The touch layer 30 is connected to the display substrate 40 through an optical adhesive 50, and the cover plate 20 is connected to the touch layer 30 through the optical adhesive 50.

The display substrate 40 includes a first region 401, a second region 402, and a bendable region 403 between the first region 401 and the second region 402 (the bendable region 403 is distinguished from the first region 401 and the second region 402 by a dashed line in FIG. 2). In addition, as shown in FIG. 2, a circuit board 60 is bound and connected to the second region 402.

After the heat dissipation plate 5 assembly has been bonded to a back side of the display substrate 40 and before the bendable region 403 of the display substrate 40 is bent, the second portion 52 of the heat dissipation plate 5 has been removed, that is, after the display substrate 40 has been bent, the fourth portion 32 of the protective film 3 is reversely bent and bonded to a back side of the first portion 51 of the heat dissipation plate 5, so that the heat dissipation plate 5 connected to the back side of the display substrate 40 remains substantially the same in thickness after the bending, and an effect of thinning the display module is achieved.

By integrating the protective film 3 with the heat dissipation plate 5 as one piece, the portion of the protective film 3 corresponding to the bendable region 403 of the display substrate 40 is synchronously cut in the step of cutting the heat dissipation plate 5, which eliminates the step of removing part of the protective film 3 on the display substrate 40 separately as compared to the method in the conventional technology in which the portion of the protective film 3 corresponding to the bendable region 403 of the display substrate 40 is removed, thereby avoiding the problem of poor removal effect of the portion of the protective film 3 caused by the laser and also reducing the cost.

In the embodiment of the present disclosure, the display substrate is a flexible display substrate, and the display module is particularly suitable for an OLED display device. The display module further includes a flexible circuit board, a printed circuit board, a backplane, and the like.

In addition, an embodiment of the present disclosure further provides a method for assembling a display module, including:

S1: bonding a cover plate and a display substrate 40;

S2: bonding the above-described heat dissipation plate 5 assembly to the display substrate 40; and S3: bending a bendable region 403 of the display substrate 40 to which the heat dissipation plate 5 assembly has been bonded.

In this embodiment, the display substrate includes, for example, a first region 401, a second region 402, and a bendable region 403 between the first region 401 and the second region 402. The bonding the above-described heat dissipation plate 5 assembly to the display substrate 40 includes:

S21: removing the protective film 3 on a side of the display substrate 40 distal to the cover plate;

S22: removing the second release film 1 on the protective film 3 of the heat dissipation plate 5 assembly;

S23: bonding the heat dissipation plate 5 assembly, from which the second release film 1 has been removed, to the side of the display substrate 40 distal to the cover plate, so that the third portion 31 of the protective film 3 is bonded to the first region 401 of the display substrate 40, and the fourth portion 32 of the protective film 3 is bonded to the second region 402 of the display substrate 40; and S24: removing the first release film 6 and the second portion 52 of the heat dissipation plate 5.

After the heat dissipation plate 5 assembly has been bonded to the back side of the display substrate 40 and before the bendable region 403 of the display substrate 40 is bent, the second portion 52 of the heat dissipation plate 5 has been removed, that is, after the display substrate 40 has been bent, the fourth portion 32 of the protective film 3 is reversely bent and bonded to a back side of the first portion 51 of the heat dissipation plate 5, so that the heat dissipation plate 5 connected to the back side of the display substrate 40 remains substantially the same in thickness after the bending, and an effect of thinning the display module is achieved.

In this embodiment, the step S3 of bending the bendable region 403 of the display substrate 40 to which the heat dissipation plate 5 assembly has been bonded includes: bending the bendable region 403 of the display substrate 40 to which the heat dissipation plate 5 assembly has been bonded, so that the fourth portion 32 of the protective film 3 is bent reversely and bonded to the first portion 51 of the heat dissipation plate 5.

In this embodiment, the display substrate 40 includes the first region 401, the second region 402, and the bendable region 403 between the first region 401 and the second region 402. The method for assembling the display module further includes step S4: binding and connecting a circuit board 60 to the second region 402 of the display substrate 40 after the display substrate 40 has been bent.

In this embodiment, the display substrate 40 is a display motherboard that includes a plurality of display substrates arranged in an array, or is a single display substrate.

In this embodiment, when the display substrate is a display motherboard, prior to step S1 of bonding the cover plate and the display substrate, the method further includes S0: performing a cutting process including chamfering and non-rectangularly cutting on the display motherboard to obtain a plurality of display substrates.

The above are some optional embodiments of the present disclosure. It should be noted that several improvements and modifications can be made by those of ordinary skill in the art, without departing from the principles described in the present disclosure. These improvements and modifications should also be considered as falling within the scope of this disclosure.

What is claimed is:

1. A heat dissipation plate assembly for heat dissipation of a display substrate, the display substrate comprising a first region, a second region, and a bendable region between the first region and the second region,
wherein the heat dissipation plate assembly comprises:
a first release film;
a heat dissipation plate, comprising a first portion and a second portion which are separated by a space and located on the first release film;
a protective film, located on a side of the heat dissipation plate distal to the first release film, having a substantially same shape as the heat dissipation plate, and comprising a third portion located on the first portion and a fourth portion located on the second portion, the third portion being able to be bonded to the first region of the display substrate, and the fourth portion being able to be bonded to the second region of the display substrate; and
a second release film, located on a side of the protective film distal to the heat dissipation plate and having a substantially same shape as the first release film,
wherein the heat dissipation plate is integrated with the protective film, and a portion of the protective film corresponding to the bendable region of the display substrate is removed while the heat dissipation plate is subjected to a cutting processing.

2. The heat dissipation plate assembly according to claim 1, wherein the protective film is connected with the heat dissipation plate through a first connection adhesive layer.

3. The heat dissipation plate assembly according to claim 2, wherein the first connection adhesive layer is formed of a pressure sensitive adhesive.

4. The heat dissipation plate assembly according to claim 1, wherein a second connection adhesive layer is provided between the second release film and the protective film.

5. The heat dissipation plate assembly according to claim 4, wherein the second connection adhesive layer is formed of a pressure sensitive adhesive.

6. The heat dissipation plate assembly according to claim 1, wherein the heat dissipation plate comprises one or more of grid tape, foam, graphite sheet, and copper foil.

7. The heat dissipation plate assembly according to claim 1, wherein the display substrate is a flexible display substrate.

8. The heat dissipation plate assembly according to claim 7, wherein the display substrate is an organic light-emitting diode (OLED) display substrate.

9. A display module, comprising a heat dissipation plate assembly for heat dissipation of a display substrate, the display substrate comprising a first region, a second region, and a bendable region between the first region and the second region,
wherein the heat dissipation plate assembly comprises:
a first release film;

a heat dissipation plate, comprising a first portion and a second portion which are separated by a space and located on the first release film;
a protective film, located on a side of the heat dissipation plate distal to the first release film, having a substantially same shape as the heat dissipation plate, and comprising a third portion located on the first portion and a fourth portion located on the second portion, the third portion being able to be bonded to the first region of the display substrate, and the fourth portion being able to be bonded to the second region of the display substrate; and
a second release film, located on a side of the protective film distal to the heat dissipation plate and having a substantially same shape as the first release film,
wherein the heat dissipation plate is integrated with the protective film, and a portion of the protective film corresponding to the bendable region of the display substrate is removed while the heat dissipation plate is subjected to a cutting processing.

10. The display module according to claim 9, wherein the protective film is connected with the heat dissipation plate through a first connection adhesive layer.

11. The display module according to claim 10, wherein the first connection adhesive layer is formed of a pressure sensitive adhesive.

12. The display module according to claim 9, wherein a second connection adhesive layer is provided between the second release film and the protective film.

13. The display module according to claim 12, wherein the second connection adhesive layer is formed of a pressure sensitive adhesive.

14. The display module according to claim 9, wherein the heat dissipation plate comprises one or more of grid tape, foam, graphite sheet, and copper foil.

15. The display module according to claim 9, wherein the display substrate is a flexible display substrate which is an OLED display substrate.

16. A method for assembling a display module, comprising:
bonding a cover plate and a display substrate;
bonding a heat dissipation plate assembly to the display substrate; and
bending a bendable region of the display substrate to which the heat dissipation plate assembly has been bonded,
wherein the display substrate comprises a first region, a second region and the bendable region between the first region and the second region,
wherein the heat dissipation plate assembly comprises:
a first release film;
a heat dissipation plate, comprising a first portion and a second portion which are separated by a space and located on the first release film;
a protective film, located on a side of the heat dissipation plate distal to the first release film, having a substantially same shape as the heat dissipation plate, and comprising a third portion located on the first portion and a fourth portion located on the second portion, the third portion being able to be bonded to the first region of the display substrate, and the fourth portion being able to be bonded to the second region of the display substrate; and
a second release film, located on a side of the protective film distal to the heat dissipation plate and having a substantially same shape as the first release film,
wherein the heat dissipation plate is integrated with the protective film, and a portion of the protective film corresponding to the bendable region of the display substrate is removed while the heat dissipation plate is subjected to a cutting processing.

17. The method for assembling a display module according to claim 16, wherein the bonding the heat dissipation plate assembly to the display substrate comprises:
removing the protective film on a side of the display substrate distal to the cover plate;
removing the second release film on the protective film of the heat dissipation plate assembly;
bonding the heat dissipation plate assembly, from which the second release film has been removed, to the side of the display substrate distal to the cover plate; and
removing the first release film and the second portion of the heat dissipation plate.

18. The method for assembling a display module according to claim 16, wherein the bending the bendable region of the display substrate to which the heat dissipation plate assembly has been bonded comprises:
bending the bendable region of the display substrate to which the heat dissipation plate assembly has been bonded so as to bend the fourth portion reversely and bond the reversely bended fourth portion to the first portion of the heat dissipation plate.

19. The method for assembling a display module according to claim 16, wherein the display substrate is a display motherboard or a single display substrate.

20. The method for assembling a display module according to claim 19, wherein
prior to the bonding the cover plate and the display substrate, the method further comprises:
cutting the display motherboard non-rectangularly to obtain a plurality of display substrates.

* * * * *